United States Patent [19]

Benveniste et al.

[11] Patent Number: 5,023,458

[45] Date of Patent: Jun. 11, 1991

[54] ION BEAM CONTROL SYSTEM

[75] Inventors: Victor M. Benveniste, Magnolia; Edward K. McIntyre, Jr., West Roxbury, both of Mass.

[73] Assignee: Eaton Corporation, Cleveland, Ohio

[21] Appl. No.: 487,158

[22] Filed: Mar. 1, 1990

Related U.S. Application Data

[63] Continuation-in-part of Ser. No. 293,334, Jan. 4, 1989, Pat. No. 4,914,305.

[51] Int. Cl.$^5$ .............................................. H01J 37/30
[52] U.S. Cl. .......................... 250/396 R; 256/492.21; 256/423 R
[58] Field of Search ............. 250/398, 396 R, 492.21, 250/423 R; 313/360.1, 363.1

[56] References Cited

U.S. PATENT DOCUMENTS

| 3,717,785 | 2/1973 | Guernet | 250/396 R |
| 3,795,833 | 3/1974 | King et al. | 250/396 R |
| 4,522,657 | 6/1985 | Rohatgi et al. | 437/24 |
| 4,578,589 | 3/1986 | Aitken | 250/281 |
| 4,724,328 | 2/1988 | Lischke | 250/396 R |

Primary Examiner—Bruce C. Anderson
Attorney, Agent, or Firm—Watts, Hoffmann, Fisher & Heinke Co.

[57] ABSTRACT

An ion implantation source used in an ion implantation system. The source produces multiple beam portions which combine to form a large diameter beam of the size of a workpiece. By controlling beam neutralization of the individual beam portions the ion density as a function of position within the cross-section of the beam can be controlled.

12 Claims, 4 Drawing Sheets

ION BEAM CONTROL SYSTEM

CROSS REFERENCE TO RELATED APPLICATIONS

The present patent application is a continuation-in-part of U.S. Pat. No. 4,914,305, entitled "Uniform Cross Section Ion Beam", now U.S. Pat. No. 4,914,305.

TECHNICAL FIELD

The present invention relates to an ion beam system for treating a workpiece.

BACKGROUND ART

Ion beam treatment of workpieces such as silicon wafers for manufacture of semiconductor material is well-known in the prior art. Charged ions are created and accelerated to a specific velocity and caused to impinge upon a workpiece such as a silicon wafer. The prior art techniques for doping silicon wafers to produce semiconductor material are broadly divided into two classes of implanters.

High dose implanters typically use an ion source and focusing components for directing a high energy ion beam along a specified travel path. At an implant zone or station, the workpiece to be implanted is mechanically moved through the high energy ion beam in a controlled fashion to achieve uniform ion beam treatment of the workpiece. A U.S. prior art patent assigned to the Eaton Corporation which discloses and describes such a high energy ion implantation system is U.S. Pat. No. 4,234,797 to Ryding. This patent is incorporated herein by reference.

A second broad class of ion implantation systems use less intense ion beams which can be controllably deflected away from an initial trajectory to impinge upon different zones or areas at an implantation station. This type of lower intensity system also includes an ion beam source and focusing components for directing an ion beam along a specified trajectory. Along this trajectory, however, are positioned electric field creating electrodes which are energized in a controlled manner to deflect the ion beam away from the initial trajectory to the workpiece, typically a silicon wafer used in semiconductor manufacture. By controlling the voltage on the scanning electrodes, a uniform pattern of ion doping of the silicon wafer can be achieved. A representative U.S. patent disclosing a low energy ion implantation system is disclosed in U.S. Pat. No. 4,736,107 to Myron which is also assigned to the Eaton Corporation and is incorporated herein by reference.

Each of the two broad classes of ion implantation systems have advantages and disadvantages. The high current ion beam implantation technique has generally resulted in reduced wafer throughput and required large, costly wafer handling stations to move the wafer through the ion beam.

Deflection scanning systems used with lower current ion beam implantation have advantages in size and simplicity but cannot be used with high currents because the deflecting electric field results in beam deneutralization and consequent beam blow-up. They also suffer a disadvantage due to the varying angle of beam incidence the ions impinge upon the wafer. This varying angle of incidence is due to the electrode scanning of the ion beam side to side across the surface of the silicon wafer.

DISCLOSURE OF THE INVENTION

One object of the present invention is an ion implantation system that combines the advantages of low and high current ion beam implanters and avoids some of the disadvantages of each type implanter.

An ion implantation system constructed in accordance with the present invention includes an ion source for providing a plurality of ion beams which collectively form the workpiece implantation beam. The ion source creates ions within a region bounded by a wall having multiple exit apertures that emit ions. Ions from a particular exit aperture form a beam portion or "beamlet." Multiple beamlets combine to form an ion beam having a beam cross section greater than that of any beam portion. The combined cross section of the ion beam is larger than the width of the workpiece being treated so that no beam or workpiece scanning is required.

An extraction plate is positioned in close proximity to the source and maintained at an electric potential which attracts ions from the source. The extraction plate defines multiple extraction apertures generally aligned with the multiple exit apertures of the source. Intensity control structure positioned near the extraction plate selectively extracts electrons from beam portions. Once a beam portion is deneutralized due to the extraction of the electrons it rapidly diffuses and is lost from the ion beam.

In accordance with a preferred embodiment of the invention multiple conductive rings for attracting electrons from the beamlets are located on an exit side of the extraction plate. The conductive rings are spaced from the extraction plate by an isolation layer applied to the extraction plate and are coupled to a source of energy by a conductive pattern deposited onto the isolation layer.

The energy source controls energization of each conductive ring to control the beam distribution across the beam cross section. This allows relatively uniform as well as controlled non-uniform ion implantation of a workpiece.

BEST MODE FOR CARRYING OUT THE INVENTION

Figure 1:
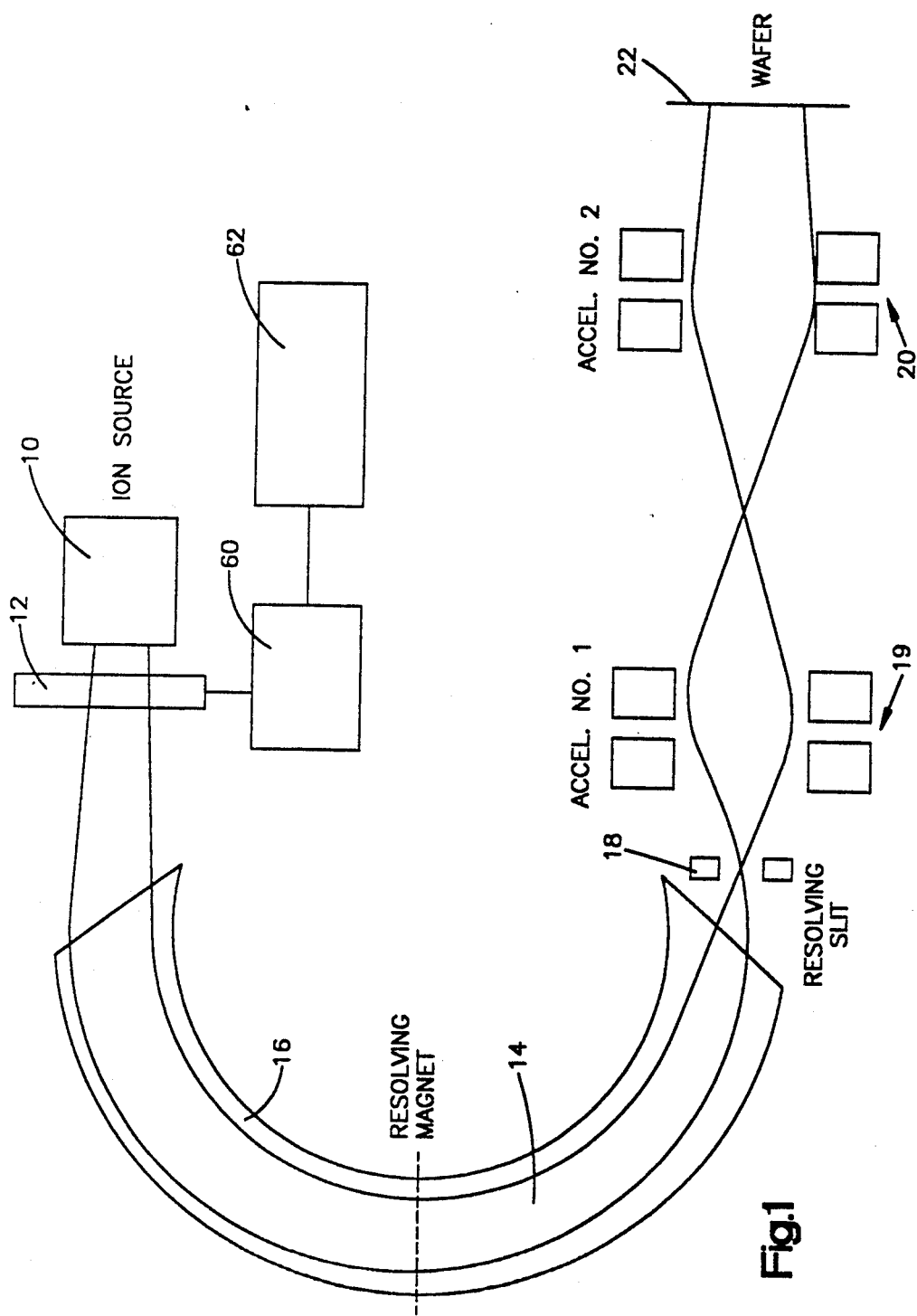
FIG. 1 is a schematic depiction an ion implantation system.

Turning now to the drawings, FIG. 1 depicts an ion implantation system including a low energy (~2 kv) ion source 10 for emitting ions that are accelerated away from the source by an ion extraction electrode 12. The source 10 emits a plurality of small cross section beams that gradually lose their definition and diffuse as they move along a travel path. This diffusion allows individual beam portions or beamlets emitted from the source 10 to combine and form a beam 14 that is wider than any of the beam portions. The ion intensity within the cross section of the ion beam 14 is controlled by removing neutralizing electrons from a given beamlet before it diffuses into the combined beam 14.

The beam 14 passes through an analyzing or resolving magnet 16 where the ions in the beam are bent in a manner dependent upon their mass and charge. Downstream from the resolving magnet 16, the beam 14 enters a metallic resolving slit 18 that defines a beam waist in a dispersive plane. Those ions passing through the resolving slit 18 are further accelerated by two accelerating tubes 19, 20 which accelerate the ions to a desired energy level (between 5 and 200 kv) and project the beam onto a workpiece 22. The two accelerating tubes 19, 20 act as a telescope and by controlling the size of the accelerating energy and distance along the beam path between the two tubes 19, 20 the size and angle of beam impact on the workpiece 22 are controlled.

The wafer 22 is moved to and from a proper position and orientation in the ion beam 14 by automatic wafer handling apparatus. Since the beam 14 is in a highly evacuated chamber from the source to the region of the wafer 22, this apparatus must move the wafers from atmospheric to very low pressure. Apparatus for accomplishing this task is known in the prior art.

No wafer scanning at the implantation station is needed since the source 10 produces a beam 14 of large enough cross section to treat the implantation surface of the workpiece 22. Additionally, no scanning electrodes are needed and therefore the electronics needed to adjust the voltage on such electrodes are avoided.

In accordance with one embodiment of the invention, the source 10 is a multi-aperture Kaufman-type source capable of producing ions having an energy of approximately 1 kilovolt and currents of approximately 10 milliamps per square centimeter. The specific source utilized in the embodiment shown in FIG. 1 includes a 3 centimeter wide ion emitting area having 288 apertures arranged in the general shape of a hexagon with a total current capability of 70 milliamps.

In the merged beam technique depicted in FIG. 1, the magnet 16 helps focus the individual beamlets forming the beam 14 into a single merged beam which is resolved through the single slit is and then accelerated as a single beam. Certain advantages accompany use of this merged beam technique over a technique where each of the beamlets are resolved and accelerated. The resolving magnet gap is kept small since the source 10 itself is smaller in cross section. The common resolving slit 18 is easier to accomplish than would be multiple slits, one for each individual beamlet. Resolving and ion acceleration are achieved more easily since duplicate acceleration electrodes for each beamlet are not needed. In addition, the simplicity of the post acceleration apparatus results in fewer surfaces to accumulate condensates.

Figure 2:
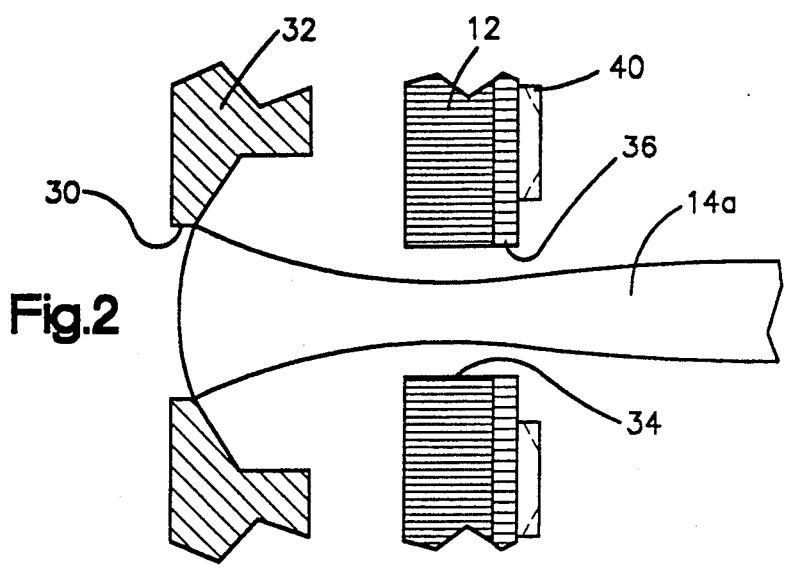
FIG. 2 is a section view showing an exit aperture and a portion of an extraction electrode for attracting ions from an ion source chamber.

FIG. 2 depicts a representative one 30 of the 288 exit apertures in the array of exit apertures defined by an aperture defining wall 32 of the ion source 10. An ion plasma exists within a confines of the ion source 10 and ions within the plasma naturally migrate to the vicinity of the wall 32 and more particularly to the vicinity of exit apertures within the wall. The extraction electrode 12 is maintained at an electrical potential of −100 volts with respect to ground and creates an electric field in the vicinity of the source 10 (which is biased at a potential of approximately 5 kilovolts) to cause ions in the plasma to be accelerated through a region between the aperture electrode 12 and the source 10. This results in the formation of a beamlet 14a that combines with other beamlets to form the beam 14.

The extraction electrode 12 defines an array 50 of apertures (FIG. 3) configured to align with the array of apertures formed in the source wall 32 and the electrode aperture 34 corresponding to the aperture 30 is shown in FIG. 2. A silicon dioxide layer 36 is deposited on one surface of the extraction electrode 12 using thick film deposition techniques. In this way each opening or aperture in the extraction plate is made slightly wider by the presence of the silicon dioxide layer 36.

As seen most clearly in FIG. 2, each of the openings defined by the extraction electrode is bounded by a control electrode or ring 40 which when energized attracts electrons within the beamlet 14a to create a net positive charge per unit volume within the beamlet. This results in a rapid destabilization of the beamlet due to repulsion between ions. This occurs within a very short distance downstream from the electrode 40 and results in a diminished contribution from the aperture 30 within the resultant ion beam 14.

Figure 3:
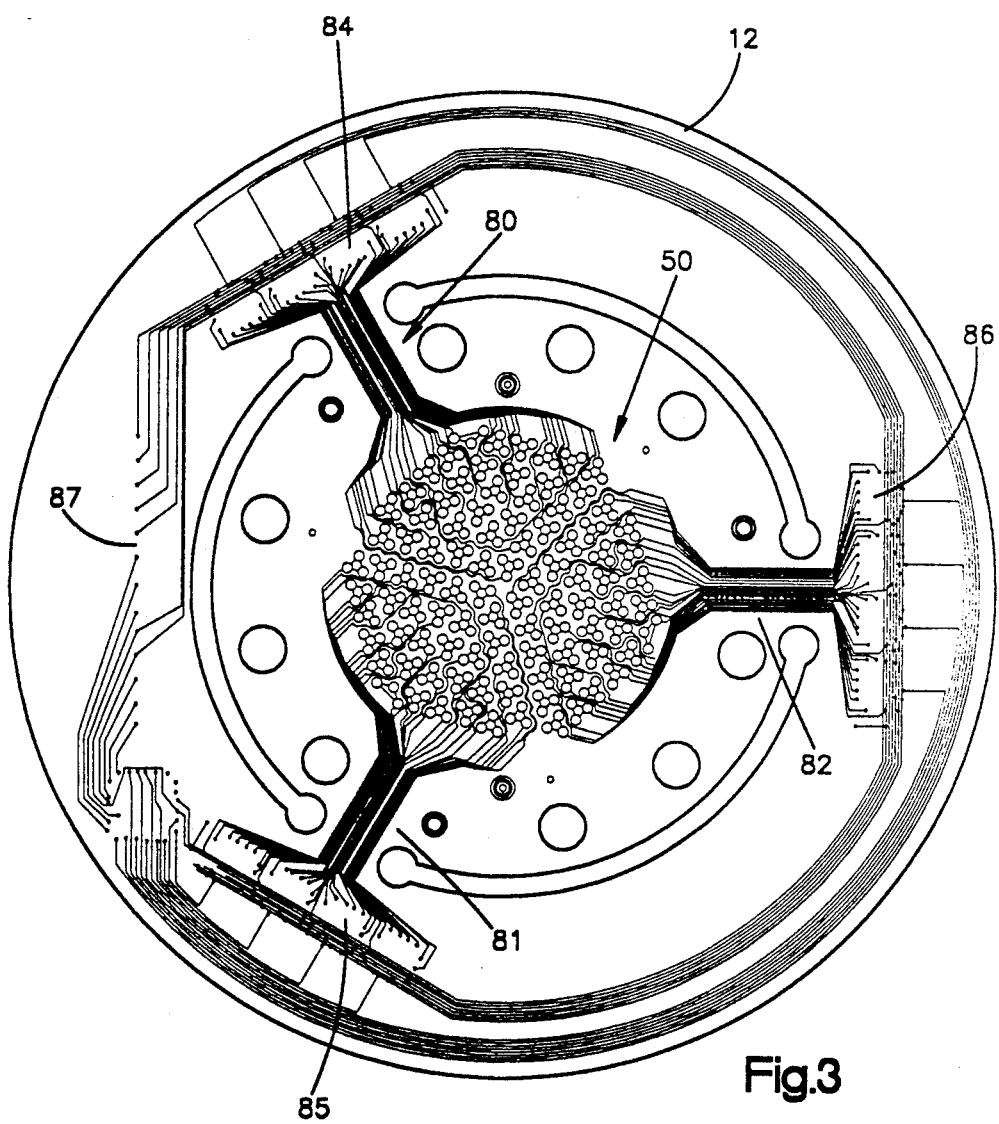
FIG. 3 is an elevation view of an exit side of an extraction plate for extracting ions from a source.

As seen in FIG. 3, the electrode array 50 surrounding the individual apertures in the extraction electrode 12 define a generally hexagon or six sided figure. Each group of three rings 50a, 50b, 50c, for example, are electrically coupled together. A conductor 52 connects the three rings 50a,50b,50c to an energy source 60 (FIG. 1). Under the control of a programmable control 62 the voltage source 60 periodically applies a voltage of +15 volts to each ring (115 volts above the −100 volt potential of the extraction electrode 12) grouping in a controlled sequence such that if a diminution of beam intensity at a particular region of the combined beam 14 is desired the ring grouping contributing to that portion of the ion beam is activated for longer time periods than other groupings within the array 50. In accordance with the preferred design, the programmable controller 62 executes a control program loaded from disk is used to adjust the energization times of various ring groupings within the array 50.

Figure 4:
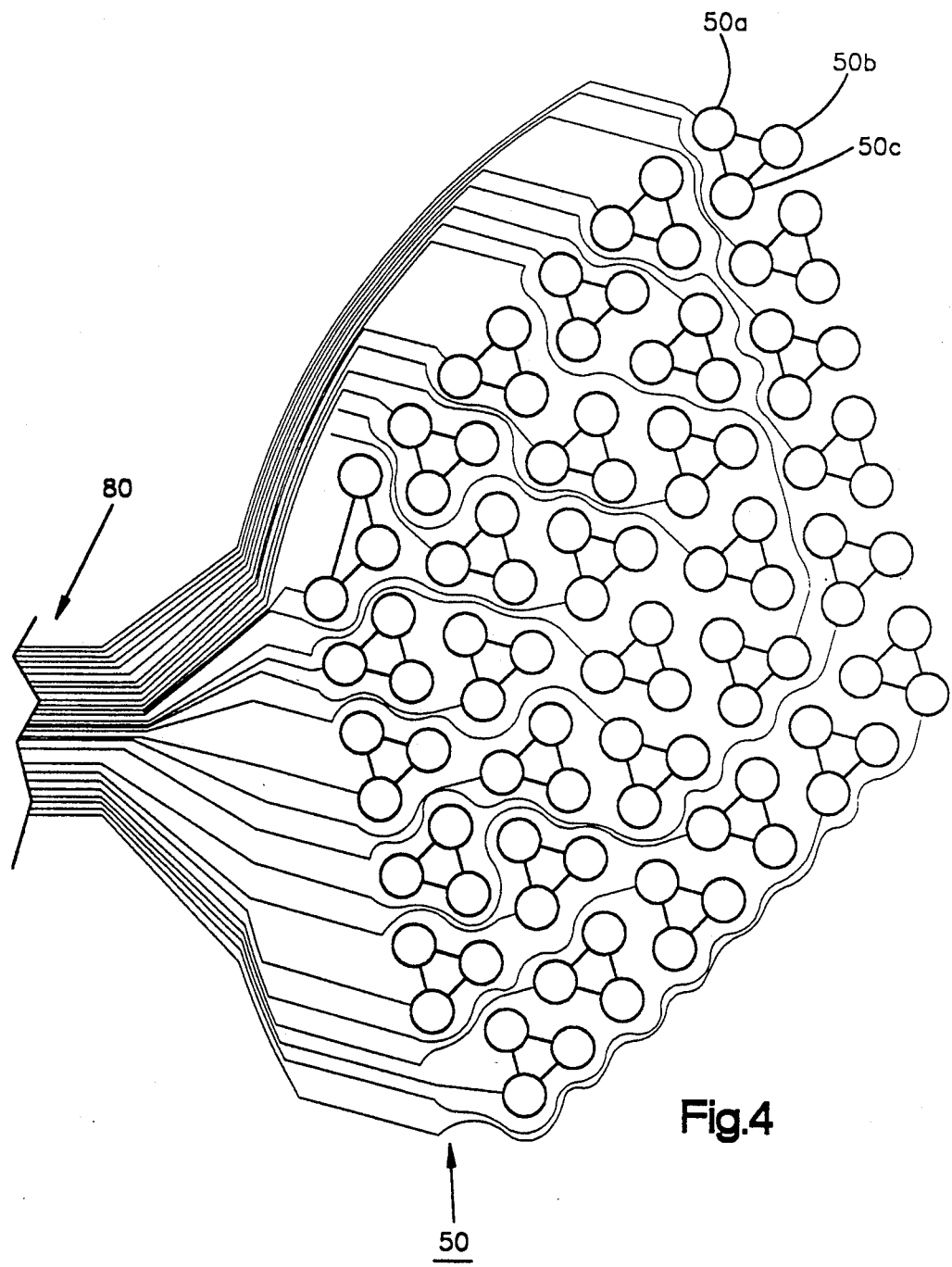
FIG. 4 is an enlarged elevation view of a portion of an array of conductive rings that are deposited onto the FIG. 3 extraction plate.

The rings and various buses depicted in FIGS. 3 and 4 are deposited onto the extraction electrode 54 using printed circuit deposition techniques well known in the prior art. Each ring 40 within the array 50 can be categorized by the conductor which transmits the ring's energization signals.

The electrodes or rings of the array 50 are divided into three portions. Each electrode portion is serviced by energization conductors that extend inward from radially outer portions of the extraction electrode 12. In combination the conductions coupled to each array portion form a bus. Thus, as seen in FIG. 3, three buses 80, 81, 82, each of which includes multiple individual electric conductors deposited onto the silicon dioxide layer 36 in patterns that lead to the array 50. In a preferred design the source 60 of voltage is supplied by integrated circuits coupled to the extraction electrode 12 at locations 84, 85, 86. Appropriate energizing signals are derived from address information routed to the electrode through a connector that engages the electrode 12 at a location 87 and communicates with the programmable controller 62.

Although in the preferred design, three rings form a ring grouping which are all electrically energized at the same potential, individual control of individual rings within an array is also possible. Additionally, jumpers or conductive patterns can be utilized to coupled together ring groupings in the event less precise control over beam intensity is needed.

Figure 5:
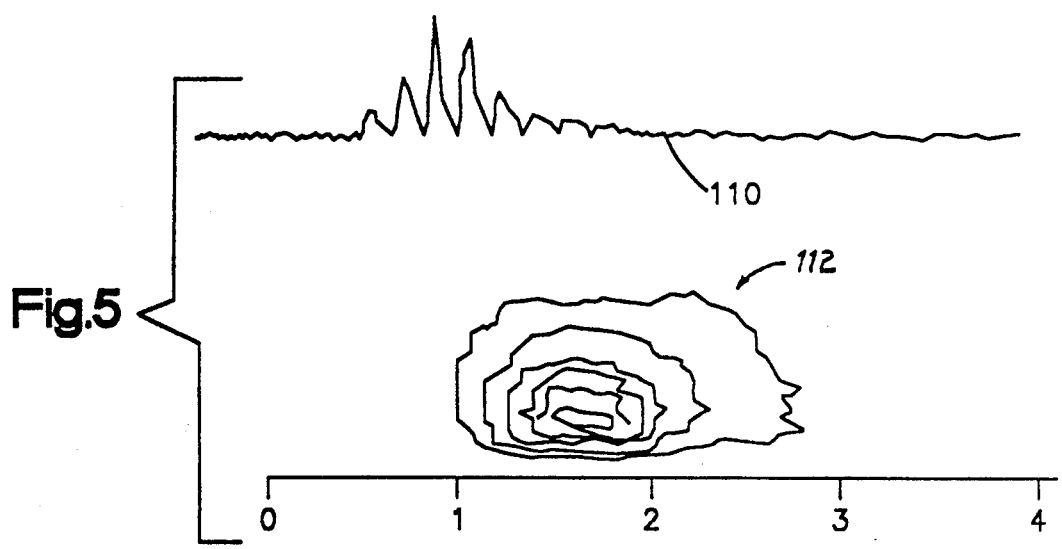
FIG. 5 is a graph showing ion concentration as a function of position within one beam portion for a representative beam neutralization energization state.
Figure 6:
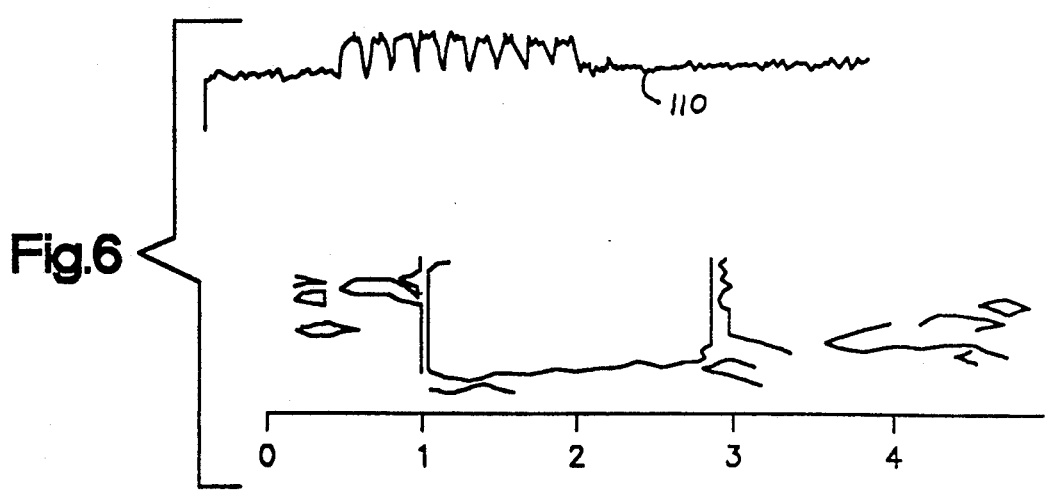
FIG. 6 is a graph showing ion concentration as a function of position with a beam portion for an alternate beam neutralization energization state.

The effect of deneutralization of the space charged within an ion beamlet as on the maintainability of the beamlet is depicted in FIGS. 5 and 6. These two figures illustrate the ion density across a representation beamlet.

In FIG. 5 a one dimensional trace 110 obtained by a raster scan process is depicted. Each spike (or small bump along portions of the trace 110) represents a line integral of the ion distribution along a line passing through the region of the beamlet. Large spikes pass through high concentrations of ions.

The series of concentric lines 112 in FIG. 5 are derived from the raster scan data. It is in the form of a two dimensional contour map (as a topographic map). Contour lines of equal ion density are drawn and the center line has the highest density. The next contour line represents a region having ½ the first etc.

FIG. 5 shows a tightly collimated beamlet, with the ½ maximum contour being approximately 1 cm in diameter. FIG. 6 shows a widely scattered beamlet, caused by electron extraction, with contour lines spread across several centimeters, beyond the area covered by the scanning device. These beamlet cross-section ion density measurements were taken at a distance 15 cm from the extraction aperture 34 (FIG. 2). This implies a ½ angle divergence of about 2 degrees in the case of FIG. 5, and in excess of 10 degrees in the case of FIG. 6.

The utilization of a large cross sectional source which produces multiple beamlets results in a non-scanning, non-deflecting ion beam system for ion implantation of a workpiece. While a preferred embodiment of the invention has been described, it is the intent that the invention cover modifications from this embodiment falling within the spirit or scope of the appended claims.

We claim:

1. A method for forming an ion beam comprising the steps of:
    (a) creating a plasma of ions within a region bounded by a wall having multiple exit apertures therein;
    (b) extracting ions from within the region by creating an electric field in the vicinity of the exit apertures for accelerating ions exiting through the apertures to form multiple beam segments which combine to form the ion beam; and
    (c) attracting charged particles from the ion beam segments as ions exit the apertures to deneutralize and thereby attenuate selected ones of the beam segments and control the ion beam intensity as a function of position within the ion beam.

2. The method of claim 1 wherein the extracting step comprises the substep of applying a voltage to a metal extraction electrode having a pattern of extraction electrode apertures that extend through the extraction electrode and which align with the multiple exit apertures in the wall.

3. The method of claim 2 wherein the attracting step comprises the substep of positioning multiple intensity control electrodes in close proximity to the extraction electrode apertures and activating individual ones of the intensity control electrodes by applying an charged particle attracting voltage to the intensity control electrodes.

4. Apparatus comprising:
    (a) source means for creating ions within a confined region and including a wall bounding the confined region having multiple exit apertures that allow ions to exit the confined region and form ion beam portions; said ion beam portions combining to form an ion beam having a beam cross section greater than that of the individual beam portions;
    (b) extraction means comprising a conductive extraction plate maintained at an electric potential for attracting ions from the source means, said conductive extraction plate including multiple extraction apertures generally aligned with the multiple exit apertures in the wall of said source means; and
    (c) intensity control means for extraction electrons from beam portions in the region of the conductive extraction plate to control beam density across the cross section of the ion beam.

5. The apparatus of claim 4 wherein the intensity control means comprise multiple conductive rings fixed with respect to the extraction plate and electrically isolated from the extraction plate.

6. The apparatus of claim 5 additionally comprising an isolation layer deposited onto a surface of the conductive extraction plate and wherein the conductive rings are affixed to the isolation layer and coupled to a voltage source by a conductive pattern deposited onto the isolation layer.

7. In an ion implantation system, apparatus for directing an ion beam along a controlled trajectory to impact a waver comprising:
    (a) ion source means for providing a plurality of relatively small cross section ion beams which combine to form a larger ion beam having a cross section on the order of the area of a wafer surface to be treated;
    (b) ion distribution control means including a plurality of spaced electrodes for deneutralizing charge in selected small cross section ion beams by attracting charged beam neutralization particles from said selected small cross section ion beams;
    (c) analyzing means for analyzing ions leaving the ion distribution control means and for directing certain ions to follow a wafer treatment trajectory;
    (d) a wafer treatment station for placing wafers in a position to intercept said certain ions after said ions exit the analyzing means; and
    (e) switching means coupled to the ion distribution control means for individually controlling biasing potentials of the spaced electrodes to provide a controlled ion distribution of ions impacting a wafer surface at the wafer treatment station.

8. The apparatus of claim 7 wherein the ion source means comprises a source chamber for confining ions, said source chamber defining a pattern of ion emitting openings extending through a wall in said chamber and wherein ions that exit the chamber through a given opening contribute to one of the small cross section ion beams.

9. The apparatus of claim 8 wherein the ion source means further comprises an extraction electrode plate having an array of openings aligned with the ion emitting openings of the chamber; said electrode plate maintained at a potential relative the chamber to accelerate ions exiting from the chamber.

10. The apparatus of claim 9 wherein the ion distribution control means comprises an array of conductive rings; wherein each ring is concentric with an opening in the extraction electrode plate and wherein the switching means routes electric potentials to said rings to extract electrons from the beams as they pass through the extraction electrode plate.

11. The apparatus of claim 10 wherein the array of conductive rings is coupled to the extraction electrode plate, spaced from a conductive surface of the extraction electrode plate by an isolation layer applied to the extraction electrode.

12. The apparatus of claim 11 wherein the switching means comprises:
(a) a programmable controller;
(b) a bus system deposited onto the isolation layer for routing extraction energization signals to the rings of said ring array; and
(c) multiplex circuitry for decoding ring address information from the programmable controller and energizing a selected pattern of rings within the array based upon the address information.

* * * * *